United States Patent
Spisak et al.

(10) Patent No.: US 6,704,830 B1
(45) Date of Patent: Mar. 9, 2004

(54) APPARATUS FOR WIRE-OR BUS EXPANSION BETWEEN TWO INSTRUMENT CHASSIS

(75) Inventors: Kevin C. Spisak, Beaverton, OR (US); Michael S. Hagen, Vancouver, WA (US)

(73) Assignee: Tektronix, Inc., Beaverton, OR (US)

( * ) Notice: Subject to any disclaimer, the term of this patent is extended or adjusted under 35 U.S.C. 154(b) by 407 days.

(21) Appl. No.: 09/741,569

(22) Filed: Dec. 19, 2000

Related U.S. Application Data

(60) Provisional application No. 60/174,636, filed on Jan. 5, 2000.

(51) Int. Cl.⁷ .......................... G06F 13/00; G06F 13/14
(52) U.S. Cl. ........................................ 710/305; 710/107
(58) Field of Search ................................. 710/305, 309, 710/200, 100, 106, 107, 240; 375/220; 326/86, 104, 125

(56) References Cited

U.S. PATENT DOCUMENTS

| | | | |
|---|---|---|---|
| 4,500,988 A | * | 2/1985 | Bennett et al. |
| 4,652,993 A | * | 3/1987 | Scheuneman et al. |
| 4,799,148 A | | 1/1989 | Nishioka |
| 5,060,139 A | | 10/1991 | Theus |
| 5,101,482 A | | 3/1992 | Kipnis |
| 5,140,680 A | | 8/1992 | Best |
| 5,163,048 A | | 11/1992 | Heutink |
| 5,274,774 A | | 12/1993 | Manber et al. |
| 5,446,287 A | | 8/1995 | Schreck |
| 5,526,496 A | | 6/1996 | Alnuweiri |
| 5,548,733 A | | 8/1996 | Sarangdhar et al. |
| 5,572,687 A | | 11/1996 | Alnuweiri |
| 5,608,883 A | | 3/1997 | Kando et al. |
| 5,621,899 A | | 4/1997 | Gafford et al. |
| 5,659,689 A | * | 8/1997 | Sarangdhar et al. |
| 5,696,976 A | | 12/1997 | Nizar et al. |
| 5,701,417 A | | 12/1997 | Lewis et al. |
| 5,701,421 A | | 12/1997 | Miller et al. |
| 5,758,169 A | | 5/1998 | Nizar et al. |
| 5,845,131 A | | 12/1998 | Kim |
| 5,898,694 A | | 4/1999 | Ilyadis et al. |
| 6,009,477 A | | 12/1999 | Sarangdhar et al. |

FOREIGN PATENT DOCUMENTS

GB     2 230 166 A     3/1989

\* cited by examiner

Primary Examiner—Gopal C. Ray
(74) Attorney, Agent, or Firm—Thomas F. Lenihan; Francis L. Gray

(57) ABSTRACT

An expanded WIRE-OR Bus structure has a first WIRE-OR Bus arrangement and a second WIRE-OR Bus arrangement. Each of the first and second WIRE-OR Bus arrangements have connected thereto at least one driver element and at least one receiver element. An intelligent bi-directional signal coupling circuit includes a buffer element, a bus arbiter, and a bus driver amplifier. The coupling circuit couples signals between the first WIRE-OR bus and the WIRE-OR second bus, and prevents signals originating on one of the WIRE-OR buses from being coupled back to the same WIRE-OR bus.

10 Claims, 5 Drawing Sheets

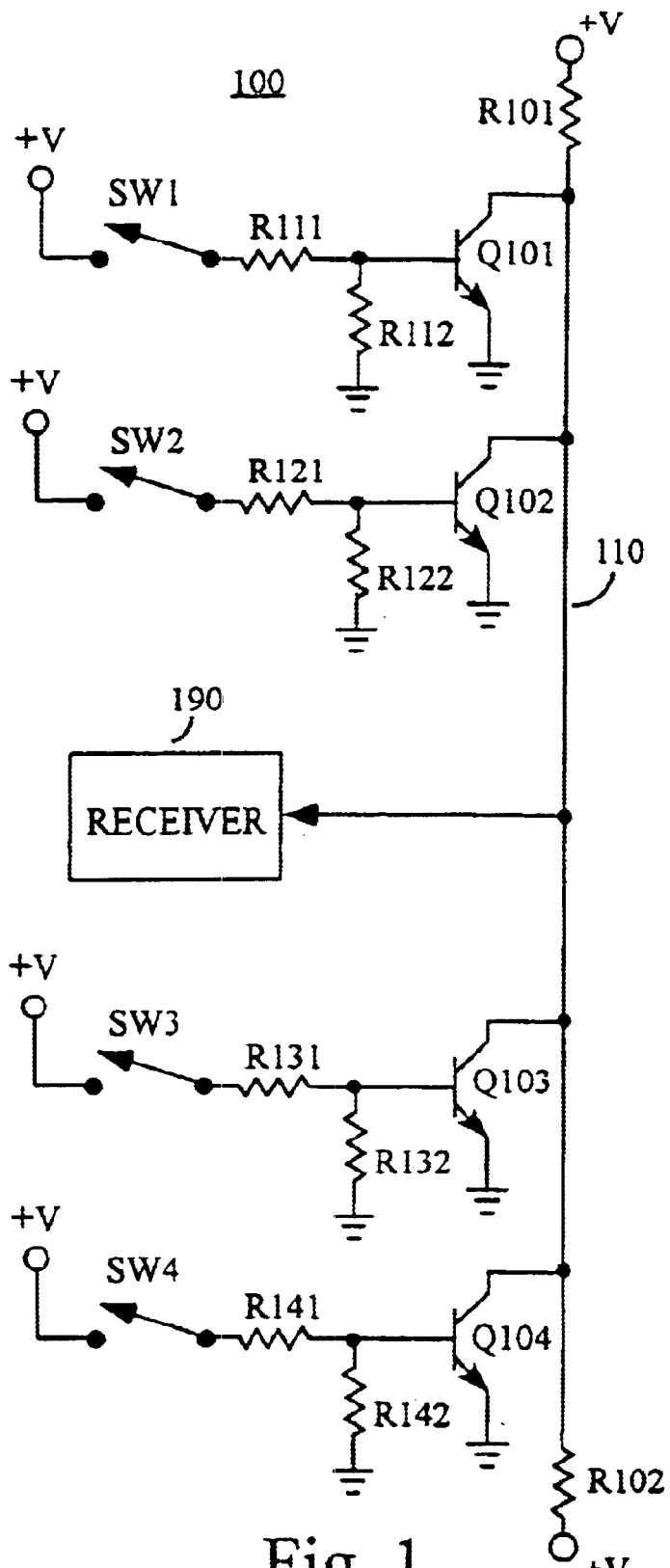
Fig. 1
*PriorArt*

APPARATUS FOR WIRE-OR BUS EXPANSION BETWEEN TWO INSTRUMENT CHASSIS

This application claims the benefit of provisional application Ser. No. 60/174,636 filed Jan. 5, 2000.

FIELD OF THE INVENTION

The subject invention generally concerns the field of trigger buses in test and measurement instruments and specifically concerns WIRE-OR bus expansion between two test and measurement instrument chassis.

BACKGROUND OF THE INVENTION

Modem test and measurement instruments have the capability of monitoring a plurality of channels simultaneously. For example, when a TLA 720 Logic Analyzer, manufactured by Tektronix, Inc., Beaverton, Oreg., is equipped to capacity with five 136-channel modules, it is capable of monitoring up to 680 channels. Signals at each of these input terminals may be acquired in response to a trigger signal asserted on a Trigger Bus. Acquisition of the data may be required when any of a variety of trigger sources detects a particular triggering condition. For example, a user may desire the instrument to trigger on detection of a glitch, upon detection a runt signal (a signal of lesser than normal, improper, amplitude), or upon detection of a signal that failed to complete within a specified time period. A detector for each of these (and many other) conditions will produce its own trigger signal. A Trigger Bus is a commonly-used method for combining multiple trigger signals for use by an acquisition system.

A WIRE-OR Trigger Bus generally employs a plurality of open-collector transistor bus drivers, each having its collector connected to a common bus conductor that is coupled to a source of positive potential via a pull-up resistor. When no driver is active, the bus is pulled to a high logic level potential by the pull-up resistor. When any of the drivers is actively conducting (i.e., sinking current through the pull-up resistor), the bus is pulled to a low logic level state. The term WIRE-OR is used to describe this arrangement because it produces an output that corresponds to that of a traditional logic-OR function. That is, if one or more of the input signals assume an active state, then the output is driven to an active state. noted at this point that what is being described is a Trigger Bus and not a Data Bus. Data buses are concerned with data integrity, and commonly employ tri-state drivers and anti-collision software or circuitry to ensure that data from only one driver is applied to the data bus at any given time.

In contrast, for a trigger bus, any actual trigger signal may be combined with any number of other trigger signals, without concern. Note that it is important that all receivers coupled to a Trigger Bus receive all of the trigger signals. By WIRE-ORing the trigger signals, each receiver will respond to the first of the triggers that pulls the Trigger Bus to its active state. The above-described WIRE-OR Bus is well-known in VXI applications, and is defined by VXI Bus Specification VXI-11, Rev. 1.0, Jul. 17, 1995.

It is important to note that, when using such WIRE-OR Buses, one must ensure that the propagation delay time of the bus is much less than the rise time of the signals to be applied to the bus. Unfortunately, this consideration generally limits WIRE-OR buses to a practical physical length of about two feet (roughly 61 cm.). An undesirable phenomenon known as "current-sharing" also tends to limit the practical physical length of the WIRE-OR bus because "glitches" (i.e., spurious switching signals) begin to appear on a Trigger Bus as the physical length of the bus is increased beyond the two-foot (61 cm.) limit.

The limited practical physical length of the Trigger Bus raises an interesting problem for an engineer who needs to expand the WIRE-OR Bus to accommodate more trigger sources or receivers, yet must also conform to the requirements of the WIRE-OR Bus structure defined by the above-identified VXI Bus Specification. What is needed is an arrangement that would conform to the WIRE-OR Bus structure specification and also permit expansion to a further WIRE-OR Bus structure physically located at a distance substantially greater than the two-foot (61cm) limit noted above.

SUMMARY OF THE INVENTION

An expanded WIRE-OR Bus structure has a first WIRE-OR Bus arrangement and a second WIRE-OR Bus arrangement. Each of the first and second WIRE-OR Bus arrangements have connected thereto at least one driver element and at least one receiver element. An intelligent bi-directional signal coupling circuit includes a buffer element, a bus arbiter, and a bus driver amplifier. The coupling circuit couples signals between the first WIRE-OR bus and the second WIRE-OR bus, and prevents signals originating on one of the WIRE-OR buses from being coupled back to the same (i.e., originating) WIRE-OR bus.

BRIEF DESCRIPTION OF THE DRAWING

FIG. 1 shows a simplified WIRE-OR Bus arrangement in accordance with the prior art.

DETAILED DESCRIPTION OF THE DRAWING

A simplified WIRE-OR Bus arrangement, generally designated 100, is shown in FIG. 1. A bus 110 is pulled up to a source of high logic level potential V+ by a termination represented by a pair of pull-up resistors R101, R102. In actual practice, the pull-up arrangement is a Thevenin equivalent resistive circuit. Each of a plurality of NPN driver transistors has its respective collector terminal coupled to a point on Bus 110, its respective emitter terminal coupled to ground, and each I biased to an OFF state by a base pull-down resistor R112, R122, R132, R142. In the following discussion, one skilled in the art will quickly realize that signal polarities and transistor conduction types are a matter of design choice. For example, a PNP transistor and a source of negative potential could have been employed without departing from the teaching of the subject application. Likewise, an FET arrangement could be substituted for the above-described bipolar transistor arrangement without significant effort.

For purposes of explanation only, the base terminal of each driver transistor Q101, Q102, Q103, Q104 is coupled to a source of positive voltage through a current limiting resistor R111, R121, R131, R141, and through a normally open SPST (single pole single throw) switch SW1, SW2, SW3, SW4. When switch SW1 is closed (i.e., placed in an active state), a drive signal is applied to the base terminal of driver transistor Q101, causing transistor Q101 to turn on and sink current through pull-up resistors R101 and R102. This causes a low logic level signal to appear at the junction of pull-up resistors R101, R102 and Bus 110. Thus, an active level signal (active high) applied to an input produces an active level signal (active low) as an output signal.

The circuitry of driver transistors Q102, Q103, Q104 operate in an identical manner to the above-described operation of transistor 0101, and produce an identical output signal at WIRE-OR Bus 110. Recall that each of the driver transistors are connected to Bus 110 via its respective collector terminal. If two or more of open collector driver transistors 0101, 0102, 0103, 0104 are turned on simultaneously, no damage will occur to them or to any other of the driver transistors coupled to Bus 110, because none of the driver transistors can source a current to the bus. That is, driver transistors Q101, Q102, Q103, Q104 can never be "bucking" one another. Thus this arrangement implements a logic OR function in that it will produce an active output signal for a condition in which one or more input signal terminals receive an active input signal.

As noted above, the arrangement works well for signals that can be combined at a single signal output terminal, and for a bus having a physical length of approximately two feet (61 cm) or less.

Figure 2:
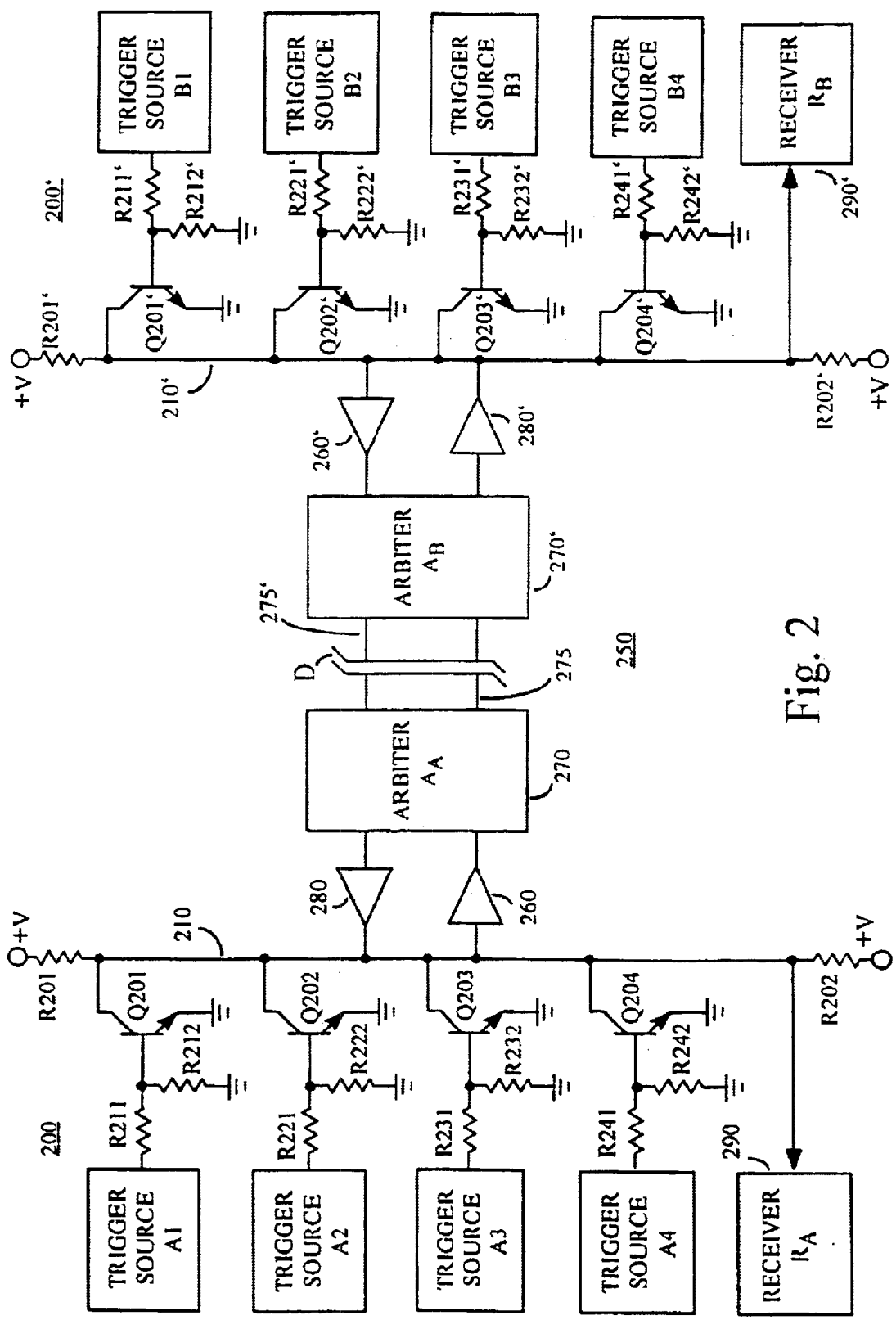
FIG. 2 shows an expanded WIRE-OR Bus in accordance with the invention.

The invention will now be described with respect to FIGS. 2, 3, and 4. Referring to FIG. 2, a pair of WIRE-OR Buses, generally designated 210, 210', are coupled together by a coupling arrangement generally designated 250. WIRE-OR buses 210, 210' are functionally identical to WIRE-OR bus 110 of FIG. 1 and need not be described again.

Coupling arrangement 250 provides two oppositely-oriented unidirectional trigger signal paths for coupling signals originating on bus 210 to bus 210', and for coupling signals origination on bus 210' to bus 210. Coupling arrangement 250 comprises buffer amplifiers, 260, 260', a pair of bus arbiters 270, 270', and a pair of open-collector driver transistors 280, 280'. A pair of transmission lines 275, 275' span a physical distance D between Bus Arbiters 270, 270', where distance D may be, for example, four feet (122 cm.). Coupling arrangement 250 operates as follows. A trigger signal originating on Bus 210 is buffered by Buffer Amplifier 260 and applied to a first input of Bus Arbiter 270. If, at this time, there is no trigger signal being asserted from WIRE-OR Bus 210', then the trigger signal originating on WIRE-OR Bus 210 will be applied to WIRE-OR Bus 210' via Bus Arbiter 270' and open-collector amplifier 280'. Conversely, a trigger signal originating on Bus 210' is buffered by Buffer Amplifier 260' and applied to a first input of Bus Arbiter 270'. If, at this time, there is no trigger signal being asserted from WIRE-OR Bus 210, then the trigger signal originating on WIRE-OR Bus 210' will be applied to WIRE-OR Bus 210 via Bus Arbiter 270 and open-collector amplifier 280.

In this way, a trigger signal originating on either of WIRE-OR Bus 210 or WIRE-OR Bus 210' will be propagated to the other WIRE-OR Bus. It is important to note that Bus Arbiters 270, 270' serve an essential purpose by preventing a lock-up condition from occurring. For example, in the absence of Bus Arbiters 270, 270', a trigger signal originating on WIRE-OR Bus 210 would be coupled via buffer 260 to open collector amplifier 280' for application to WIRE-OR Bus 210', and the trigger signal would be immediately retransmitted back to WIRE-OR Bus 210 by the action of buffer 260' and open collector amplifier 280. Thus, the active low logic level signal condition at the input of buffer 260 would be reinforced thereby locking-up both WIRE-OR buses 210, 210'.

Figure 3:
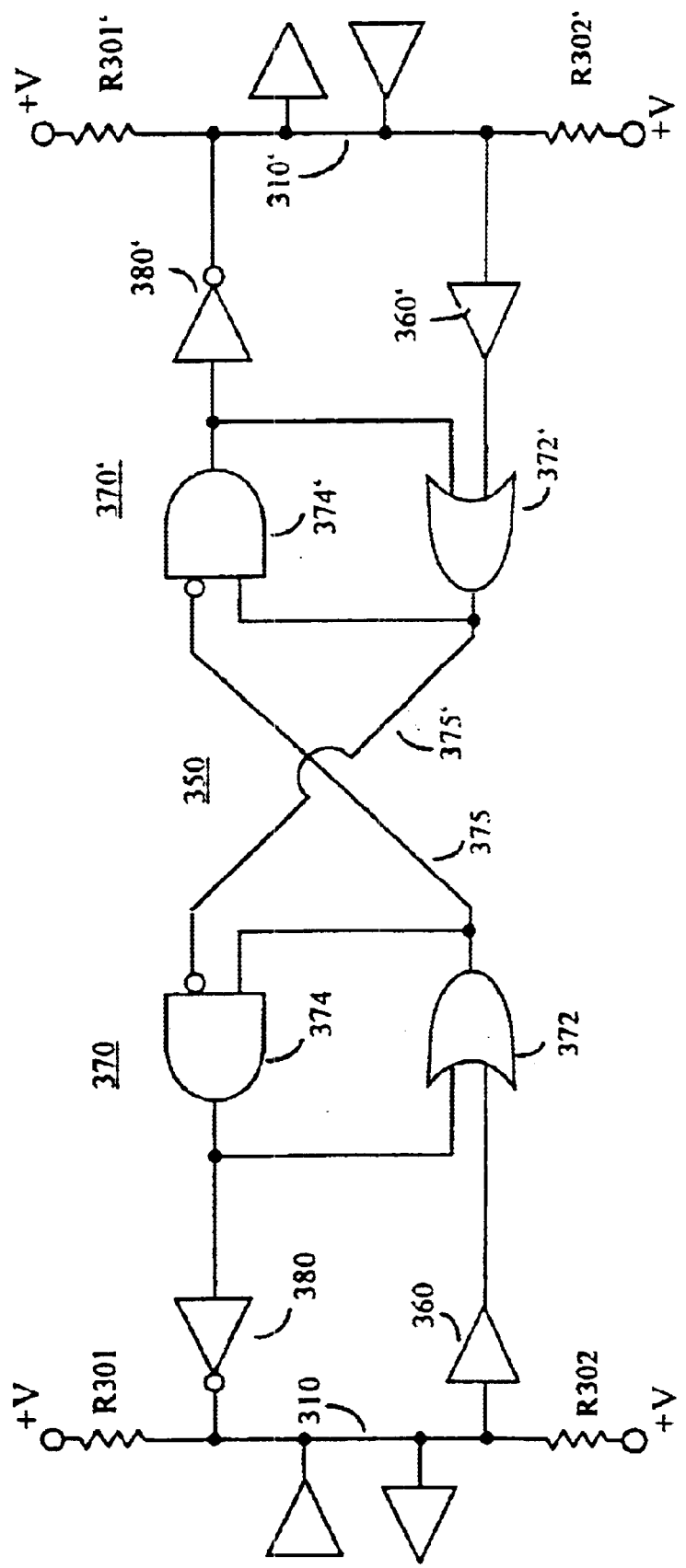
FIG. 3 shows a detailed view of a Bus Arbiter in accordance with the invention.

Now that the importance of Bus Arbiters 270, 270' has been established, let us refer to FIG. 3 for a more detailed explanation of their structure and operation. FIG. 3 is a simplified illustration of a trigger signal coupling arrangement generally designated 350 in accordance with the subject invention. Those elements of FIG. 3 having similar reference numerals to elements of FIG. 2 serve the same function and need not be described again.

Bus Arbiter 370 comprises an OR-gate 372 and an AND-gate 374. OR-gate 372 has a first input terminal coupled to the output terminal of buffer amplifier 360 for receiving a buffered version of the signal present on WIRE-OR Bus 310. OR-gate 372 has a second input terminal coupled to the output terminal of AND-gate 374, and to the input terminal of open collector inverter 380. OR-gate 372 has an output terminal coupled to a transmission line 375. In this embodiment, transmission line 375 is chosen to be 4 feet (122 cm.) in length, which is a reasonable length for coupling a trigger signal to WIRE-OR Bus 310' in an adjacent chassis. It should be noted that transmission line 375 is not limited to any particular physical length. The output terminal of OR-gate 372 is also coupled to a first input terminal of AND-gate 374. AND-gate 744 has a second input terminal that has an inverting function associated with it as shown by the inversion bubble. The second input terminal of AND-gate 374 is also coupled to a transmission line 375' for receiving a trigger signal originating on WIRE-OR Bus 310' for ultimate application to WIRE-OR Bus 310. Bus Arbiter 370' is identical to Bus Arbiter 370 and need not be fully described.

In operation, the usual and normal condition of WIRE-OR buses 310, 310' is an inactive, pulled-up state. Therefore, at the start of this discussion we will assume that no trigger signal is applied, and that therefore both WIRE-OR Buses 310, 310' are at a high logic level. A Trigger Signal may be applied to either WIRE-OR Bus, let us assume for this explanation that it is applied to WIRE-OR Bus 310. When a trigger signal (i.e., a low logic level signal) is applied to WIRE-OR Bus 310, it is buffered by buffer amplifier 360 and applied to one input of OR-gate 372. With no trigger signal applied from WIRE-OR Bus 310', then at this time, the signal level on WIRE-OR Bus 310' is a logic high level. This logic high level is applied to one input of OR-gate 372', causing a high logic level signal to be developed at its output terminal. This high logic level output signal is applied to the inverting input of AND-gate 374 via transmission line 375'. A high logic level on the inverting input terminal of AND-gate 374 causes a low logic level signal to be developed at its output terminal regardless of the state of the signal at its other input terminal. The low logic level signal developed at the output terminal of AND-gate 374 is coupled to open collector inverter 380 thereby maintaining open collector inverter in its OFF state. The low logic level signal developed at the output terminal of AND-gate 374 is also coupled to the second input terminal of OR-gate 372, thereby allowing the passage of the low logic level trigger signal to the inverting input of AND-gate 374' via transmission line 375. Recall that a high logic level signal is applied to the second input terminal of AND-gate 374' by OR-gate 372'. The combination of a high logic level signal at the non-inverting terminal of AND-gate 374' and a low logic level signal at its inverting terminal, causes a high logic level signal to be developed at the output terminal of AND-gate 374'. This high logic level signal is applied to the second input terminal of OR-gate 372' thus causing a high level signal to be developed at its output regardless of the state of the signal at its other input terminal. The high logic level signal developed at the output terminal of AND-gate 374' is also applied to the input terminal of open collector inverter 380'. In this way, a trigger signal (i.e., a low level signal) originating on WIRE-OR Bus 310 has been coupled to a second WIRE-OR Bus 310' in another chassis.

Note that the low level signal applied to WIRE-OR Bus 310' is immediately felt at the input terminal of buffer amplifier 360', and passed to the first input terminal of OR-gate 372'. Recall that, at this time, a high logic level signal exists at the second input terminal of OR-gate 372', thus preventing the low logic level signal present on WIRE-OR Bus 310' from being passed back to WIRE-OR Bus 310, and preventing the lock-up condition described above.

When high-speed trigger signals are being coupled back and forth, propagation delay within the components of the coupling circuitry and a relatively slow rise time of the WIRE-OR Bus itself may become factors. In the extreme, a race condition may develop which could prevent proper operation of the simplified circuitry of FIG. 3. Such a race condition may be described as follows. Assume that a low logic level signal is being asserted on WIRE-OR Bus 310'. If so, then AND-gate 374 is applying a high logic level signal to one input of OR-gate 372, and at the same time, buffer 360 is applying a low logic level signal to the other input of OR-gate 372. When the trigger signal ceases to be applied to WIRE-OR Bus 310', that fact will propagate through the system and result in a low logic level signal being developed at the output of AND-gate 374 and the input of OR-gate 372. Although the low logic level signal at its input caused open-collector driver inverter 380 to release WIRE-OR Bus 310, capacitive loading on the bus results in a slow rise time. Thus, the low level signal developed at the ouput of AND-gate 374 arrives at one input of OR-gate 372 while the other input is still in a low logic level condition. This results in a generation of a false low logic level signal at the output of OR-gate 372. Fortunately, circuitry is provided to prevent this falsely-generated low logic level signal from being coupled all the way through to WIRE-OR bus 310'.

Figure 4:
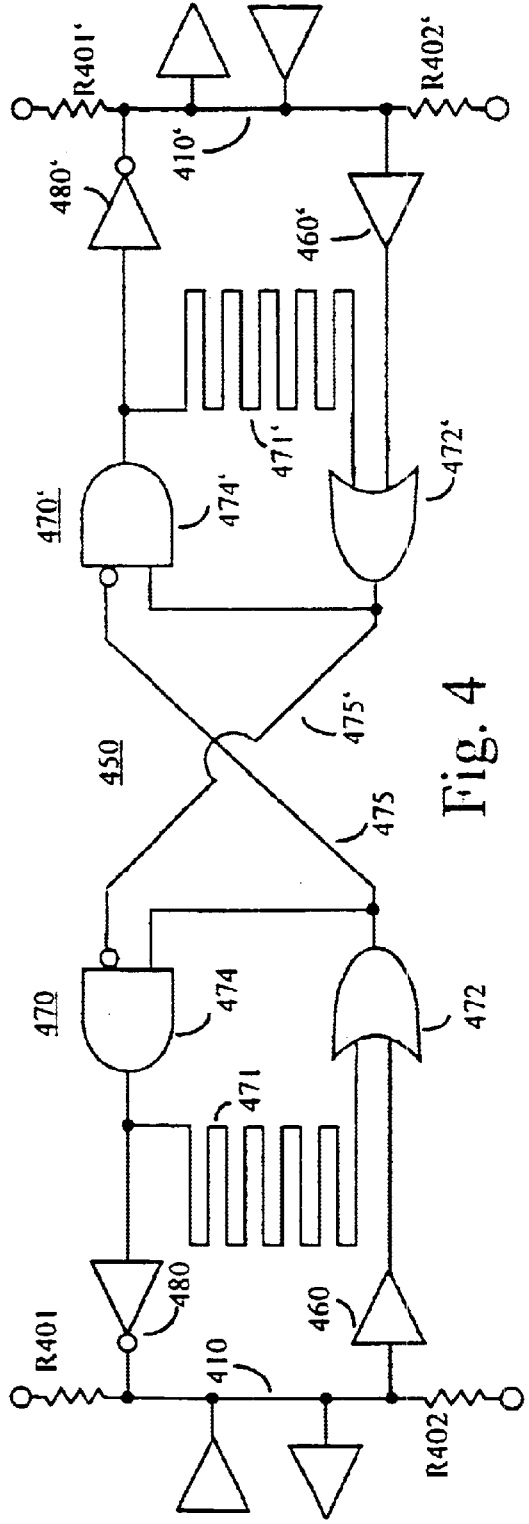
FIG. 4 shows a detailed view of a modified Bus Arbiter for use with ECL circuitry.

Referring to FIG. 4, components bearing similar reference numerals to elements of FIG. 3 serve the same function and need not be described again. For ECL (emitter coupled logic) circuitry, a delay circuit 471 is sufficient to eliminate the problem noted above. This is accomplished by delaying the low logic level signal developed by AND-gate 474 from being applied to the input of OR-gate 472 until after WIRE-OR Bus 410 has had time to recover to a high logic level condition. Delay circuit 471 is preferably a "trace delay" circuit (i.e., a serpentine layout of a printed circuit board trace).

Figure 5:
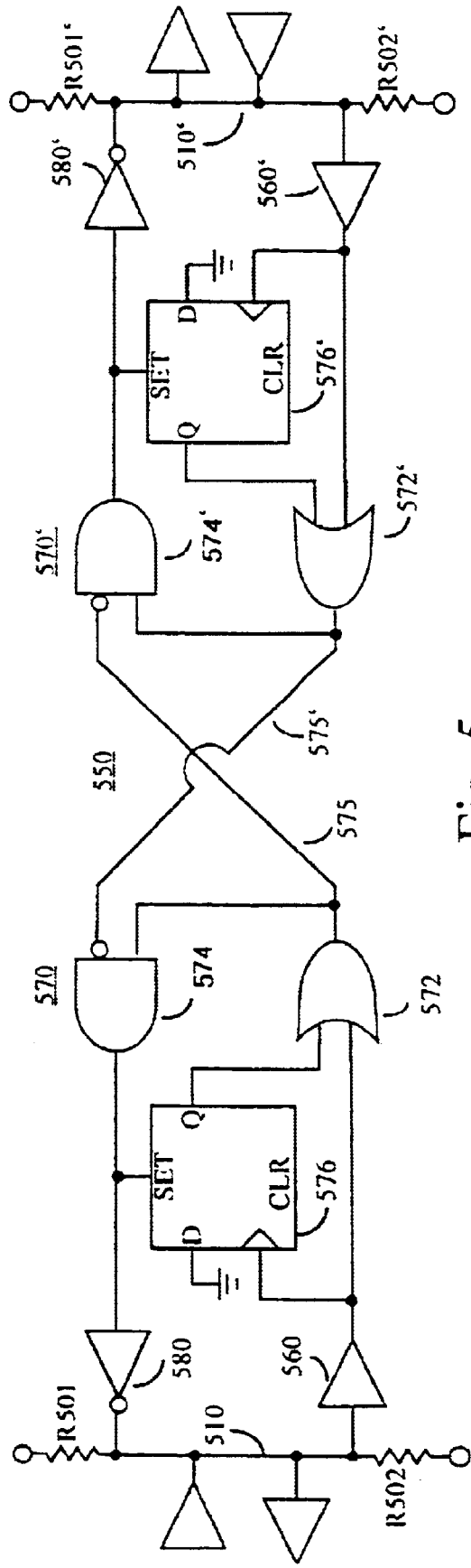
FIG. 5 shows a detailed view of a modified Bus Arbiter for use with TTL circuitry.

For TTL circuitry, the circuit of FIG. 5 may be employed to ensure proper operation. In FIG. 5, a pair of D Flip-flop Circuits 576, 576' have been added to ensure that a low logic level signal developed by AND-gate 574 does not reach OR-gate 572 until after a signal at WIRE-OR Bus 510 is unasserted. This solution prevents the above-mentioned race condition from developing. All other components in FIG. 5 serve the same purpose as similarly numbered components in FIG. 3.

Assume that neither WIRE-OR Bus 510 or 510' is pulled low. Further, assume that Flip-flops 576 and 576' are reset such that a low logic level signal is developed at their respective Q-outputs and applied to first input terminals of OR-gates 572 and 572' respectively. In operation, a negative-going trigger signal applied to WIRE-OR Bus 510 applies a low logic level signal to a second input of OR-gate 572. The presence of two low logic level signals on the respective input terminals of OR-gate 572 causes a low logic level signal to be coupled across transmission line 575 and applied to the inverting input of AND-gate 574'. This in turn caused a high logic-level signal to be applied to the SET input terminal of flip-flop 576', and to the input terminal of inverter 580', thus coupling the trigger signal to WIRE-OR Bus 510'. The high logic level signal applied to the SET input of flip-flop 574' causes the signal developed at its Q-output to assume a high logic level state. The high logic level signal developed at the Q-output is coupled to one input of OR-gate 572' thus blocking all low level signals from passing through OR-gate 572' until the low logic level trigger signal is unasserted from WIRE-OR Bus 510'. The trigger signal asserted onto WIRE-OR Bus 510' by open collector inverter 580' will be immediately coupled through buffer 560' to the clock input terminal of flip-flop 576'. However, a negative-going signal will have no effect on the output of flip-flop 576' because the clock input terminal is responsive to rising-edge signals only.

When WIRE-OR Bus 510 stops asserting a low level signal, the output terminal of AND-gate 574' will resume its normal low logic level. However, a low level signal applied to the SET terminal of flip-flop 576' will have no effect on its output. Thus, the high level signal will continue to be developed at the Q-output terminal, which continues to block false signals from being transmitted back to WIRE-OR bus 510 until WIRE-OR Bus 510' recovers to its normal high logic level state. As WIRE-OR Bus 510' assumes a high logic level state, a rising-edge signal is applied to the clock input terminal of Flip-flop 576'. This causes a signal developed at the Q-output of flip-flop 576' to be reset to a low logic level signal, readying it for the next trigger assertion. It is important to note that the above described race condition is prevented because OR-gate 572' is not unblocked until after WIRE-OR Bus 510' recovers to its normal high logic level state.

Figure 6:
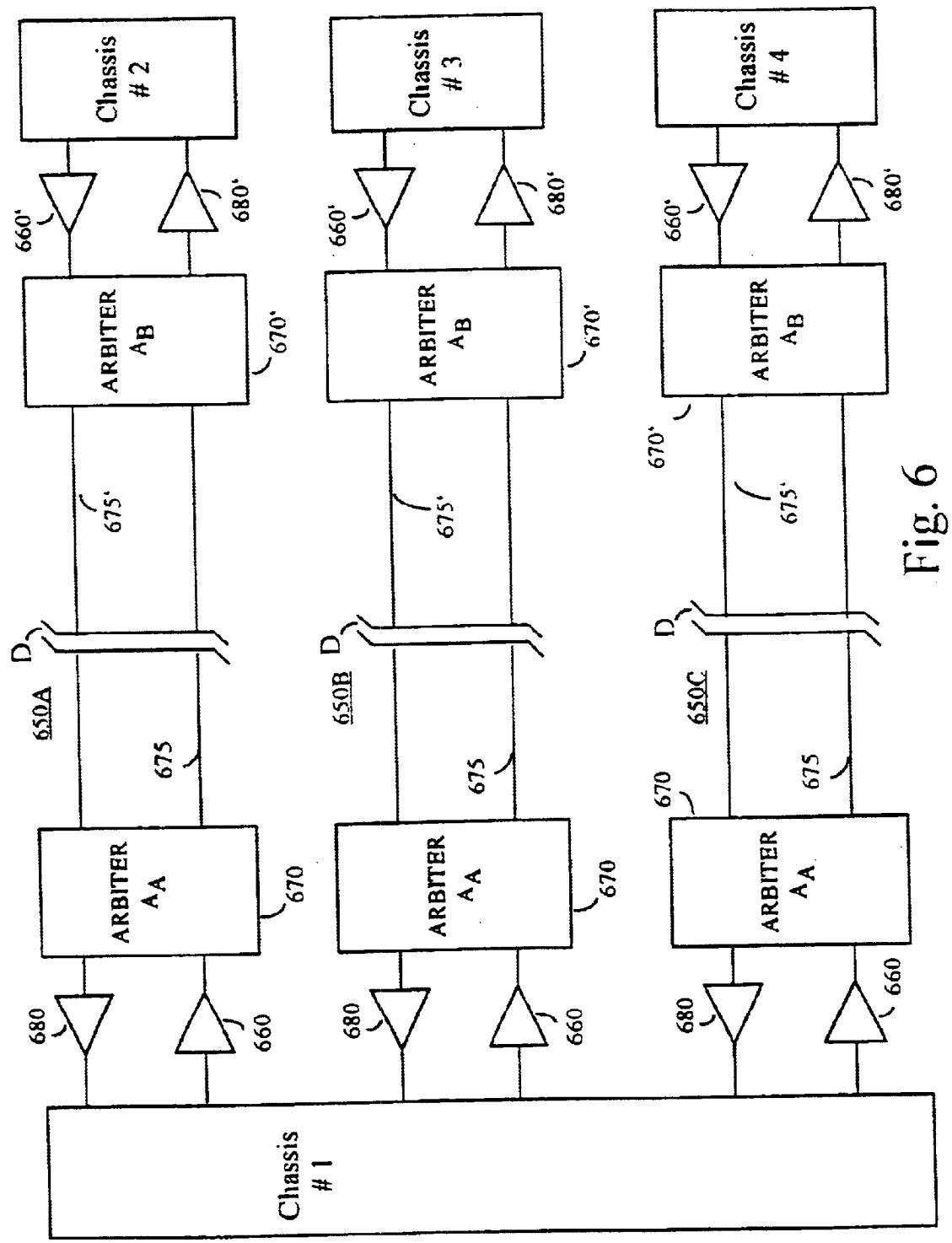
FIG. 6 shows a star arrangement of expanded WIRE-OR Buses in accordance with the invention.

FIG. 6 shows the coupling arrangement of the subject invention employed in the familiar star (also known as a hub and spoke) configuration with chassis #1 at the center of the star, and chassis #2, 3, and 4 at the periphery. Similarly numbered elements in FIG. 6 to elements of previous FIGURES serve the same purpose, and need not be described again.

In operation, a signal originating on a WIRE-OR Bus in chassis #1 will be coupled substantially simultaneously to WIRE-OR Buses in chassis #2, 3, and 4. Conversely, a signal originating on chassis #3 will be coupled to a WIRE-OR Bus in chassis #1, and thereafter will be substantially simultaneously transmitted to chassis #2 and 4.

Although not specifically illustrated, the invention is also usable in a configuration in that is daisy-chained (i.e., serially-coupled) from one chassis to another. One skilled in the art will realize that daisy-chaining the circuits will introduce delay in the time when a trigger signal is asserted on a WIRE-OR Bus at or near the end of the chain, with respect to the time when the trigger signal appears on a WIRE-OR bus at or near the beginning of the chain. Therefore, one skilled in the art will realize that the subject invention is usable in those applications in which such delay is tolerable.

What has been described is an arrangement for coupling a trigger signal between two WIRE-OR Buses physically separated by a distance that would otherwise cause a delay greater than one-half of the rise-time of the signals of interest, while maintaining the characteristic operation of each of the WIRE-OR Buses, and preventing a lock-up condition from occurring on the WIRE-OR Buses.

While the bus driver amplifiers have been described as "open-collector", that term is intended to be broad enough to encompass FET devices having "open-drain" outputs, and the like.

What is claimed is:

1. An extended WIRE-OR bus arrangement, comprising:

a first WIRE-OR bus;

a second WIRE-OR bus; and a bi-directional signal coupling circuit connected between said first and second WIRE-OR buses for coupling signals between said first and second WIRE-OR buses, said bi-directional signal coupling arrangement including a bus arbiter for preventing a signal originating on one of said WIRE-OR buses from being coupled back to said originating WIRE-OR bus.

2. The extended WIRE-OR bus arrangement of claim 1, wherein:

said bi-directional signal coupling circuit comprises a buffer amplifier for receiving signals from said first WIRE-OR bus, and a bus driver amplifier for coupling said signal to said second WIRE-OR bus.

3. The extended WIRE-OR bus arrangement of claim 2, wherein:

said bus driver amplifier is an open-collector bus driver amplifier.

4. A bi-directional signal coupling circuit for coupling signals between a first WIRE-OR bus and a second WIRE-OR bus, comprising:

a first input terminal for receiving a first signal from said first WIRE-OR bus;

a first bus arbiter for permitting transmission of said first signal to said second WIRE-OR bus, and for preventing retransmission of said first signal back to said first WIRE-OR bus;

a second input terminal for receiving a second signal from said second WIRE-OR bus; and a second bus arbiter for permitting transmission of said second signal to said first WIRE-OR bus, and for preventing retransmission of said second signal back to said second WIRE-OR bus.

5. The bi-directional signal coupling circuit of claim 4, wherein:

said first input terminal is coupled to a buffer amplifier for receiving signals from said first WIRE-OR bus, and said first bus arbiter includes a bus driver amplifier for coupling said first signal to said second WIRE-OR bus.

6. The bi-directional signal coupling circuit of claim 5, wherein:

said bus driver amplifier is an open-collector bus driver amplifier.

7. The bi-directional signal coupling circuit of claim 6, wherein:

said first and second signals are trigger signals and said WIRE-OR buses are trigger buses.

8. An extended WIRE-OR trigger bus arrangement for a logic analyzer, comprising:

a first WIRE-OR bus;

a second WIRE-OR bus; and a bi-directional trigger signal coupling circuit connected between said first and second WIRE-OR buses for coupling trigger signals between said first and second WIRE-OR buses, said bi-directional trigger signal coupling arrangement including a bus arbiter for preventing a trigger signal originating on one of said WIRE-OR buses from being coupled back to said originating WIRE-OR bus.

9. The extended WIRE-OR trigger bus arrangement of claim 8, wherein:

said bi-directional trigger signal coupling circuit comprises a buffer amplifier for receiving trigger signals from said first WIRE-OR bus, and a bus driver amplifier for coupling said trigger signals to said second WIRE-OR bus.

10. The extended WIRE-OR trigger bus arrangement of claim 9, wherein:

said bus driver amplifier is an open-collector bus driver amplifier.

* * * * *